United States Patent
Neubauer et al.

(10) Patent No.: US 7,420,485 B2
(45) Date of Patent: Sep. 2, 2008

(54) SIGMA-DELTA MODULATOR AND METHOD FOR SIGMA-DELTA MODULATION

(75) Inventors: Volker Neubauer, Linz (AT); Thomas Mayer, Linz (AT); Tindaro Pittorino, Marin (CH); Yangjian Chen, Linz (AT); Linus Maurer, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/726,844

(22) Filed: Mar. 23, 2007

(65) Prior Publication Data

US 2007/0241951 A1 Oct. 18, 2007

(30) Foreign Application Priority Data

Mar. 24, 2006 (DE) .................. 10 2006 013 782

(51) Int. Cl.
*H03M 3/00* (2006.01)
(52) U.S. Cl. ..................... 341/77; 341/143; 341/155
(58) Field of Classification Search ............. 341/77, 341/143, 155
See application file for complete search history.

(56) References Cited

U.S. PATENT DOCUMENTS

2005/0225463 A1 10/2005 Rezeq et al.
2006/0038710 A1 2/2006 Staszewski et al.

*Primary Examiner*—Jean B Jeanglaude
(74) *Attorney, Agent, or Firm*—Eschweiler & Associates, LLC

(57) ABSTRACT

A sigma-delta modulator is supplied with a data word and includes a first and at least one further modulation stage, each having at least two adders. The adders in the first modulation stage process a low-significance component and a delayed more significant component of the data word and provide a result word and a carry at their respective outputs. The adders in the at least one further modulation stage process a low-significance component and a more significant component of the result word and provide a further result word and a carry at their respective outputs. The low-significance component and the more significant component of the result word are provided to the further modulation stages with an unvarying delay. A bit stream is derived from a carry from final instances of the at least two adders in the first modulation stage and in the further modulation stage respectively.

20 Claims, 10 Drawing Sheets

SIGMA-DELTA MODULATOR AND METHOD FOR SIGMA-DELTA MODULATION

REFERENCE TO RELATED APPLICATIONS

This application claims the benefit of the priority date of German application DE 10 2006 013 782.5, filed on Mar. 24, 2006 the contents of which are herein incorporated by reference in their entirety.

BACKGROUND OF THE INVENTION

In today's mobile radio systems, various mobile radio standards such as the Global System for Mobile Communication, GSM, Enhanced Data Rates for GSM Evolution EDGE, Universal Mobile Telecommunication Standard UMTS, or others are used. In this case, radio-frequency signals are used for transmission.

For generating, or receiving, the radio-frequency transmission and reception signals, digitally controlled oscillators, DCOs are increasingly being used today. As an output signal, a DCO generates a radio-frequency signal on the basis of a digital frequency word. In addition, a digital phase locked loop with a DCO requires less space on a semiconductor body than a corresponding phase locked loop with an analog-controlled voltage controlled oscillator, VCO.

By way of example, DCOs in arrangements for radio-frequency generation use binary-weighted capacitance chips to perform coarse frequency adjustment, while an arrangement with equally weighted, for example thermometer-encoded, capacitance chips regulates the oscillation frequency in operation precisely. The equally weighted capacitance chips can also be used for modulating a signal onto a fundamental of the DCO.

Systems with narrowband modulation, as in the case of GSM/EDGE, require very small frequency steps of approximately 10 kHz, whereas wideband modulation operations, as in UMTS, require a broad adjustment for the range DCO of several 100 MHz. The demands on small frequency steps and a large modulation bandwidth can be achieved with an array of equally weighted capacitance chips, for example with 512 capacitive elements, which are actuated by means of a 9-bit data word. To achieve a finer effective frequency resolution, sigma-delta modulators are used, which convert a non-integer, fractional component of a data word calculated by a digital loop filter into a radio-frequency, serial bit stream. In this case, the bit stream follows the fractional component on average over time. Individual capacitive elements of the capacitance array are therefore changed over very quickly on the basis of this bit stream in order to improve the effective frequency resolution.

A further property of sigma-delta modulators is the suppression of low-frequency quantization noise generated as a result of the switching of the capacitive elements. For this, sigma-delta modulators of relatively high order, particularly of second order, are used, for example.

FIG. 14 shows a conventional first-order sigma-delta modulator. An input 1 is supplied with a data word having a word length of eight bits. An eight-bit full adder 405 has a first input coupled to the input 1 and a second input coupled via a delay element 418 to the output of the adder 405. The word length of the result from the adder 405 is nine bits, made up of eight bits of result and one bit of carry. The carry is output as a serial bit stream on a modulator output 2.

FIG. 15 shows a conventional second-order sigma-delta modulator. An eight-bit result from the adder 405 is supplied to a further adder 505. The adder 505 likewise has a second input which is coupled via a delay element 518 to the output of the further adder 505. In this case, too, a carry bit is generated. The carry bits from the first and second adders 405 and 505 are supplied to a single-bit full adder 602, in this case once negatively via a delay element 603. The result of the addition by the adder 602 is output on the modulator output 2 as a serial bit stream with a word length of two bits.

To achieve the fine frequency resolution for GSM/EDGE despite the large physical frequency step size for adjusting the oscillation frequency in the DCO, a fractional component of eight bits at a clock frequency of approximately 1 GHz is required for the sigma-delta modulator. However, an eight-bit full adder, as shown in FIGS. 14 and 15, for example, is not able to ascertain a result at this clock frequency within one clock period of the sigma-delta modulator on account of the switching times of the logic gates in the adder. The sigma-delta modulator is therefore no longer able to operate in precise time synch.

BRIEF DESCRIPTION OF THE DRAWINGS

The invention is explained in detail below using exemplary embodiments with reference to the drawings in which.

DETAILED DESCRIPTION OF THE INVENTION

Figure 1:
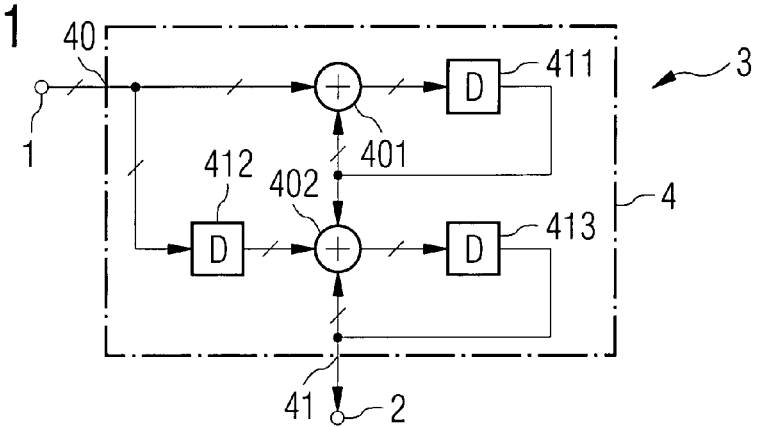
FIG. 1 shows a first exemplary embodiment of a sigma-delta modulator.

In the following description further aspects and embodiments of the present invention are disclosed. In addition, reference is made to the accompanying drawings, which form a part thereof, and in which is shown by way of illustration, in which the invention may be practiced. The embodiments herein provide a better understanding of one or more aspects of the present invention. This disclosure of the invention is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

An embodiment of a sigma-delta modulator comprises a data input for supplying a data word, a first modulation stage having at least two adders and a modulator output for outputting a bit stream. In this case, a first adder in the first modulation stage has a first input for supplying a low-significance component of the data word, a second input for supplying a delayed first result from the first adder, and an output for outputting the first result with a carry. An at least second adder in the first modulation stage has a first input for supplying a delayed more significant component of the data word, a second input for supplying a delayed second result from the at least one second adder, a third input for supplying a delayed carry from a preceding adder and an output for outputting the second result with a carry. In this case, the bit stream is derived from a carry from a final instance of the at least two adders in the first modulation stage.

The adders may be in the form of digital adders or binary adders. The signal processing in the sigma-delta modulator is effected essentially in clocked fashion, and processing steps therefore usually start at the start of a clock period of a clock signal. The bit stream is output as a serial bit stream.

If the first modulation stage has precisely two adders then a carry from a preceding adder is the carry from the first adder, and the final instance of the at least two adders is the second adder.

If the first modulation stage comprises more than two, for example three, adders then the data word is split into a low-significance component and a plurality of more significant components. The preceding adder for the second adder is the first adder, while the preceding adder for the third adder is the second adder. The final adder from whose carry the bit stream is derived is then the third adder. If the first modulation stage has further adders added to it then these are connected up accordingly.

By splitting the data word into a plurality of components with a relatively short word length, it is possible for the results from the adders to be ascertained within one clock period, and the sigma-delta modulator is thus able to operate in steady states even at higher clock frequencies.

In this case, a data word is split into a low-significance component and a remaining, more significant component. The total of the word length of the low-significance component and the word length of the more significant component may correspond to the word length of the data word. The low-significance component is supplied to a first adder, where it is added to a result from this adder from an addition preceding by one clock cycle or one clock period in time. In this case, a carry is also generated. This is supplied to a second adder together with the more significant component having a time delay of one clock period. A further summand added is the result from this second adder, with a time delay of one clock period. A carry from this second and final adder can then represent a value for the serial bit stream at the modulator output.

If the first modulation stage comprises more than two adders then the data word is split into a plurality of components. In this context, the total of the word lengths of the components gives the word length of the original data word in one preferred embodiment.

In a further embodiment, the results from the adders in the first modulation stage form a result word. The result word is provided with an unvarying delay, that means the respective results from the adders of the first modulation stage are not delayed differently. The sigma-delta modulator comprises at least one further modulation stage with at least two adders. In this case, a first adder in the further modulation stage has a first input for supplying a low-significance component of the result word, a second input for supplying a delayed first interim result from the first adder, and an output for outputting the first interim result with a carry. An at least second adder in the further modulation stage has a first input for supplying a more significant component of the result word, a second input for supplying a delayed second interim result from the at least one second adder, a third input for supplying a delayed carry from a preceding adder, and an output for outputting the second interim result with a carry. The bit stream at the modulator output is also derived from a carry from a final instance of the at least two adders in the further modulation stage.

From the results from the adders in the first modulation stage, without a carry, a result word is formed which is output to a further, for example second modulation stage. By way of example, two modulation stages are used to implement a second-order sigma-delta modulator, and every further modulation stage increases the order by one in each case. The result word is split in the further modulation stage, in a similar manner to the data word in the first modulation stage, and is supplied to the at least two adders in the further modulation stage. In this case, no additional different delay is generated for the various adders, since the results from the preceding, first modulation stage are normally in time-delay form anyway.

In a similar way to in the first modulation stage, the first adder in the second or further modulation stage is also the preceding adder for the second adder. If the second modulation stage comprises a plurality of adders, for example, three, then the second adder is the preceding adder for the third adder. The third adder is then the final adder in the modulation stage and its carry is used for providing the serial bit stream.

In this arrangement, the word length of the bit stream may correspond to a number of modulation stages. The components of the data word and/or the results or interim results from the adders in the modulation stages may respectively be delayed by delay elements. By way of example, the delay elements can be operated in clocked fashion, like master-slave flip-flops, for example.

In one embodiment, the delay in the more significant component of the data word at the first input of the at least second adder is greater than the delay in the more significant component for a preceding adder. The low-significance component which is supplied to the first adder is undelayed. A more significant component which is intended to be summed in the second adder is supplied thereto with a delay of approximately one clock cycle. A further, for example, third adder receives a third component of the data word, for example, with a delay of two clock cycles. The delay is therefore greater than for the preceding second adder in the first modulation stage.

FIG. 1 shows a first exemplary embodiment of a sigma-delta modulator with a modulator unit 3 which comprises a first modulation stage 4. The first modulation stage 4 has an input 40 which is coupled to a data input 1 in order to supply a binary data word. The first modulation stage 4 comprises an adder 401, which is coupled to the input 40, and an adder 402, which is coupled to the input 40 via a delay element 412. An output of the adder 401 has a delay element 411 connected to it whose output is routed to a second input of the adder 401 and to a further input of the adder 402. In the same way, the output of the adder 402 has a delay element 413 connected to it, which is coupled to a second input of the adder 402, and to an output 41 of the first modulation stage. The output 41 has a modulator output 2 connected to it.

The data word at the input 40 is split into a low-significance component and a more significant component. The low-significance component is supplied directly to the adder 401, while the more significant component is supplied to the adder 402 via the delay element 412. The adder 401 totals the low-significance component and a result from the adder 401 delayed by the delay element 411, so that the output of the first adder 401 generates an additional carry bit for the result from the binary addition. This carry bit is output to the second adder 402 after a delay.

The adder 402 totals the delayed more significant component and a delayed result from the adder 402 and the carry bit from the first adder 401. A carry bit from the second adder 402 is output at the output 41 or the modulator output 2.

Splitting the addition over two or more delayed additions reduces the implementation complexity in comparison with a single large adder with a longer word length. This also reduces the processing time caused by logic gates in a single adder. Particularly at high clock frequencies and hence with short clock periods, it is thus possible to ensure that an addition is complete within one clock period and hence no undefined states can arise in the sigma-delta modulator.

Figure 2:
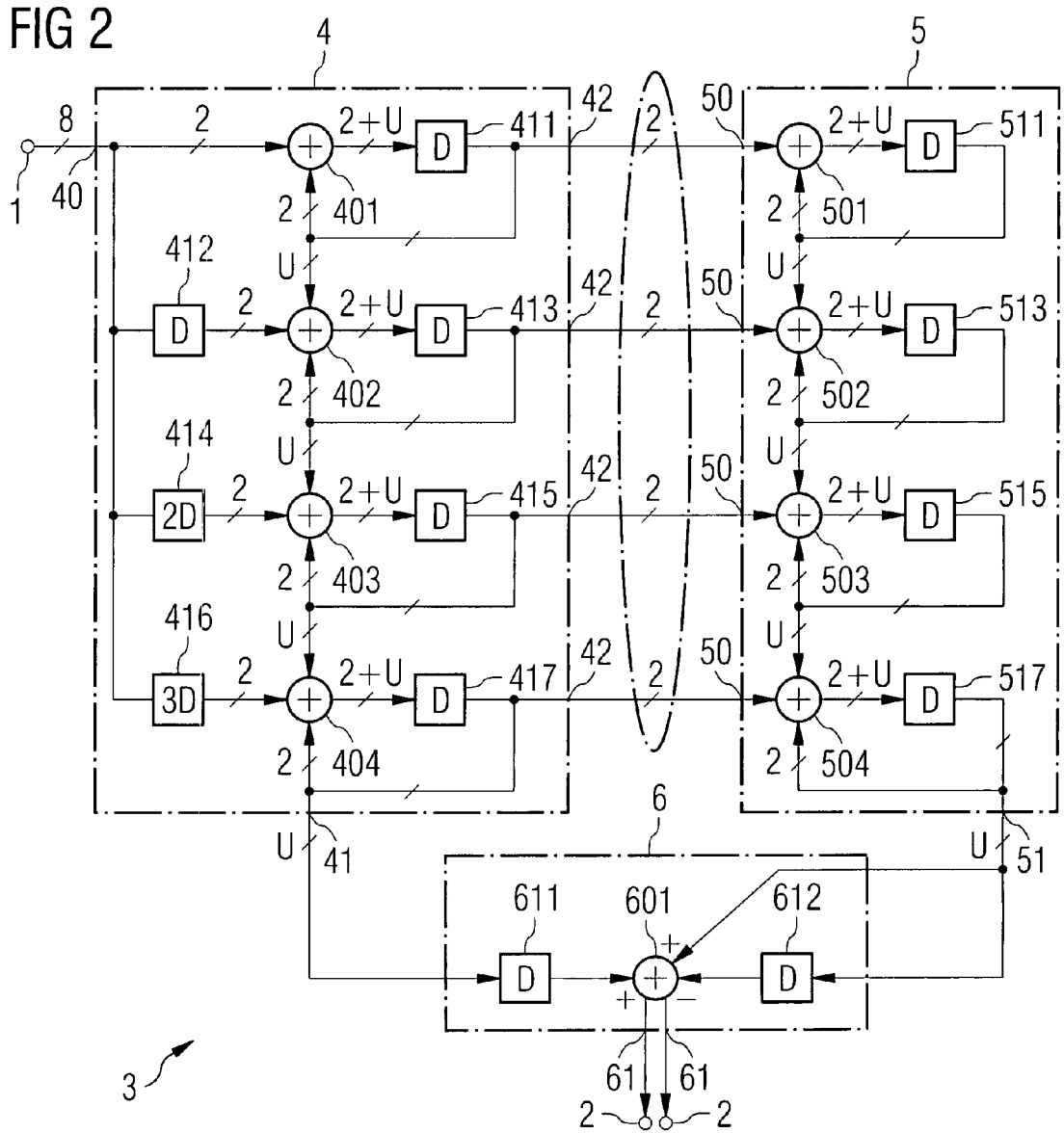
FIG. 2 shows a second exemplary embodiment of a sigma-delta modulator.

FIG. 2 shows another exemplary embodiment of a sigma-delta modulator, namely a second-order sigma-delta modulator with a modulator unit 3 which comprises a first modulation stage 4, a second modulation stage 5 and a carry computation register 6. A data input 1 is used to supply the input 40 of the first modulation stage 4 with a data word having a width of eight bits. The data word is split into four times two bits and is supplied in split form to the adders 401, 402, 403, 404. In this case, the bits are supplied to the first adder 401 directly, to the second adder 402 via a delay element 412 with a delay of one clock period, to the third adder 403 via the delay element 414 with a delay of two clock periods, and to the fourth adder 404 via the delay element 416 with a delay of three clock periods. As described for FIG. 1, the result from the first adder 401 has a word length of two bits and a carry bit, represented by the notation 2+U, which are returned after a delay or are supplied to the second adder 402. The return for the other adders 402, 403, 404 is implemented in the same way via the delay elements 413, 415, 417, in each case by one clock period. The carry bit from the final adder 404 in the first modulation stage 4 is output at the output 41 and is supplied to the carry computation register 6. The output signals from the delay elements 411, 413, 415, 417, which are also referred to as a result word or an error word, are output to the input 50 of the second modulation stage 5 via the output 42. No additional delay is introduced, especially not different delays for the different output signals from the delay elements 411, 413, 415, 417. This reduces the total time needed for processing the data word or result word respectively. The split result word is supplied to adders 501, 502, 503, 504, whose return paths with the delay elements 511, 513, 515, 517 correspond essentially to the arrangement shown in the first modulation stage 4. The output 51 outputs a carry bit from the final adder 504 and supplies it to the carry computation register 6.

As can be seen from FIG. 2, the delay elements 511, 513, 515, 517 of the second modulation stage 5 correspond to the delay elements 411, 413, 415, 417 of the first modulation stage 4. One difference between the second or any further modulation stage 5 to the first modulation stage 4 is that the further modulation stages do not comprise delay elements corresponding to delay elements 412, 414, 416 of the first modulator stage 4. The delay introduced inherently to the result word by delay elements 412, 414, 416 can be directly used in the following modulation stages, thus increasing a processing speed of the arrangement.

The carry computation register 6 has two delay elements 611 and 612 and also a single-bit full adder 601. The delay elements 611 and 612 and the adder 601 are used to generate a bit stream from the carry bit from the first and second modulation stages 4 and 5 and to output it to the modulator output 2 via the output 61.

Figure 3:
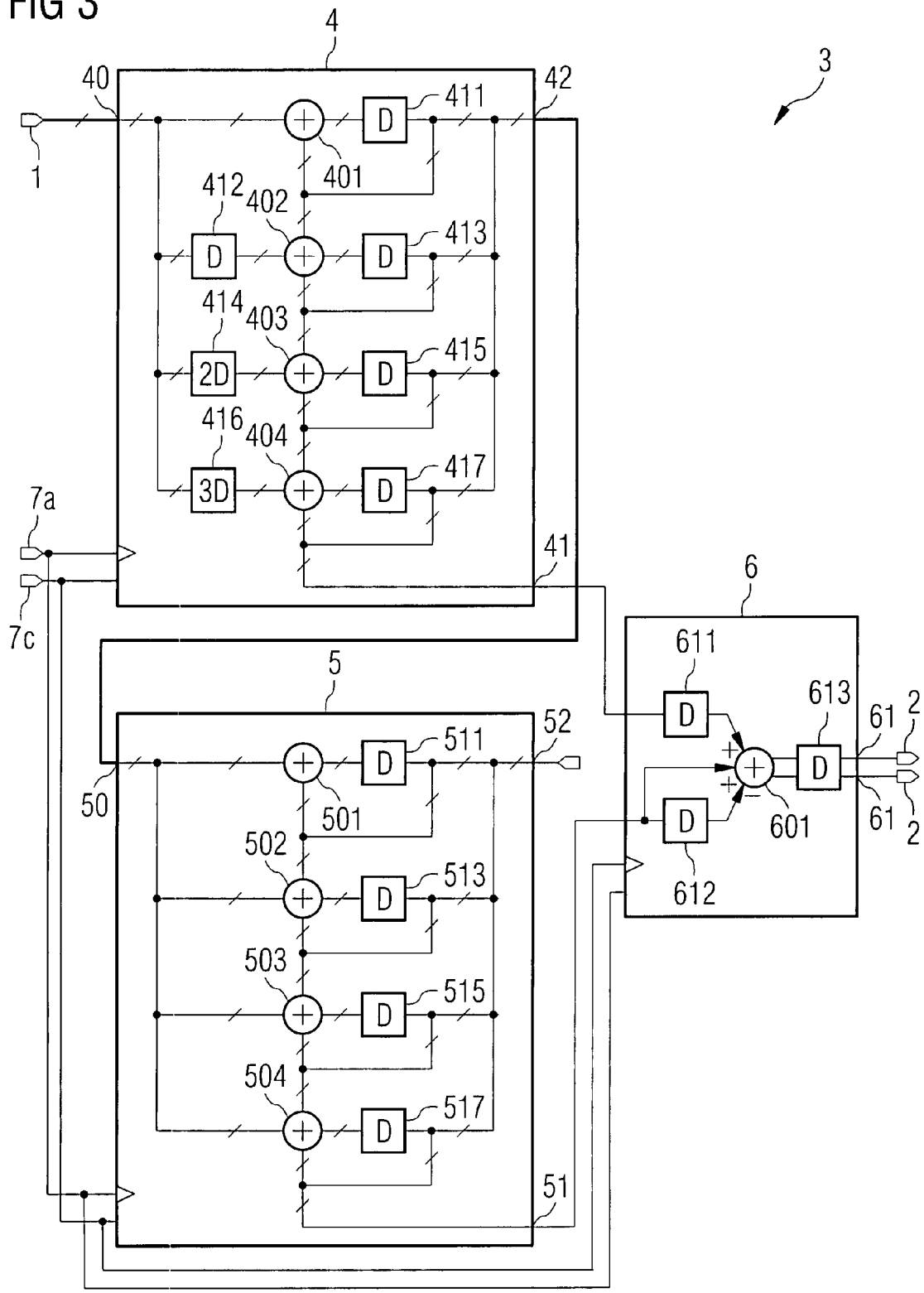
FIG. 3 shows a third exemplary embodiment of a sigma-delta modulator.

FIG. 3 shows another exemplary embodiment of a second-order sigma-delta modulator. The modulator unit 3 with the first and second modulation stages 4 and 5 and also the carry computation register 6 has a modulator clock input 7a and a reset input 7c. The modulator clock input 7a can be used to supply the arrangement with a modulator clock signal, which usually has a much higher clock frequency than a clock frequency at which a data word applied to the data input 1 changes. A frequency for the modulator clock signal is also called an oversampling frequency. The modulator clock signal is used to actuate all clock-dependent components, for example the delay elements. This makes it possible to ensure that the response of the sigma-delta modulator is controlled over time.

When required, a reset signal at the reset input 7c can be used to reset states of elements which store states.

Figure 4:
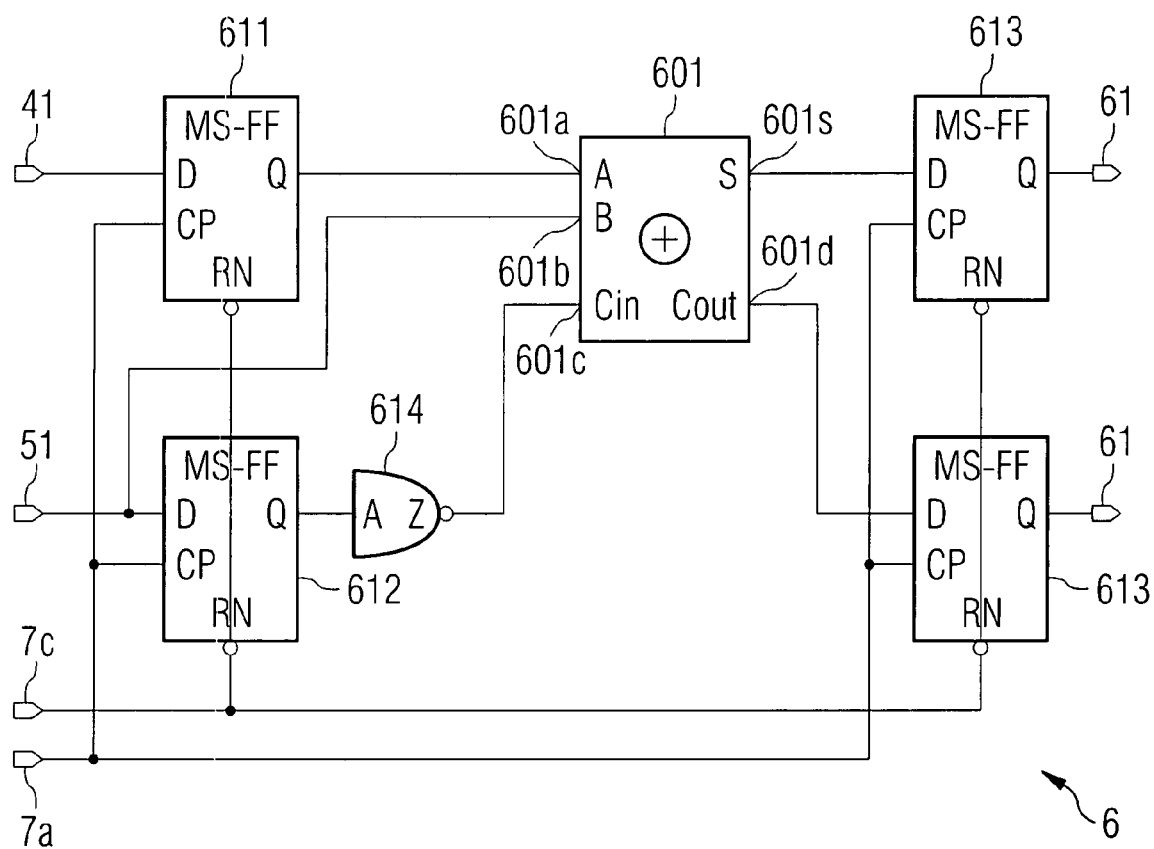
FIG. 4 shows an exemplary embodiment of a carry computation register.

FIG. 4 shows an exemplary embodiment of a carry computation register 6 as shown in FIG. 3, for example. The carry computation register 6 is connected to the outputs 41 and 51 of the first and second modulation stages 4 and 5. The delay elements 611, 612 are in the form of master-slave flip-flops and are clocked with the modulator clock signal. The single-bit full adder 601 is supplied with the delayed carry bit from the first modulation stage 4, with the undelayed carry bit from the second modulation stage 5 and with a delayed carry bit from the second modulation stage 5 which has been inverted by an inverter 614. The result which is output from the addition is two bits, which are output at the output 61 via master-slave flip-flops 613 with a delay up until the next full clock cycle and in the form of a bit stream. Since the result at the output of the adder 601 is not immediately available on account of switching times in logic gates, the delay elements 613 ensure clock-synchronous output of the bit stream.

Figure 5:
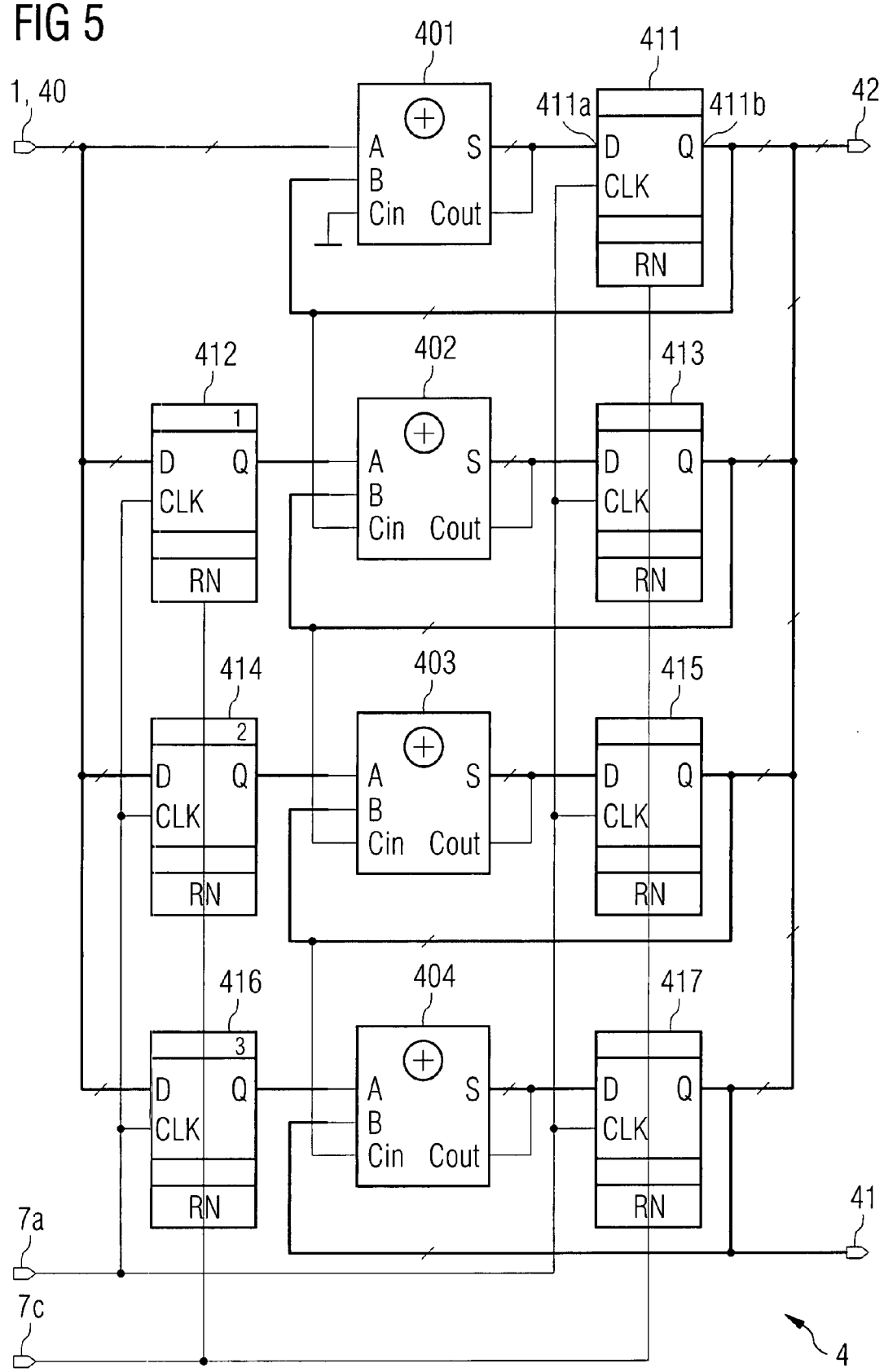
FIG. 5 shows an exemplary embodiment of a first modulation stage.

FIG. 5 shows an exemplary embodiment of a first modulation stage 4. It has an input 40 coupled to the data input 1, an output 42 for outputting the result word and an output 41 for outputting a carry bit. In addition, a modulator clock input 7a and a reset input 7c are provided. The adders 401 to 404 are in the form of two-bit full adders. For the delay elements 411 to 417, master-slave flip-flops are used, which are operated under the clocking of the modulator clock signal. Besides returning the delayed result on an adder, the delay elements 411, 413, 415, 417 also serve the purpose of compensating for processing times in the adders 401, 404 and of being able to output a result word in clock synch at the output 42.

When required, a reset signal at the reset input 7c can be used to reset the states of the master-slave flip-flops 411 to 417.

Figure 6:
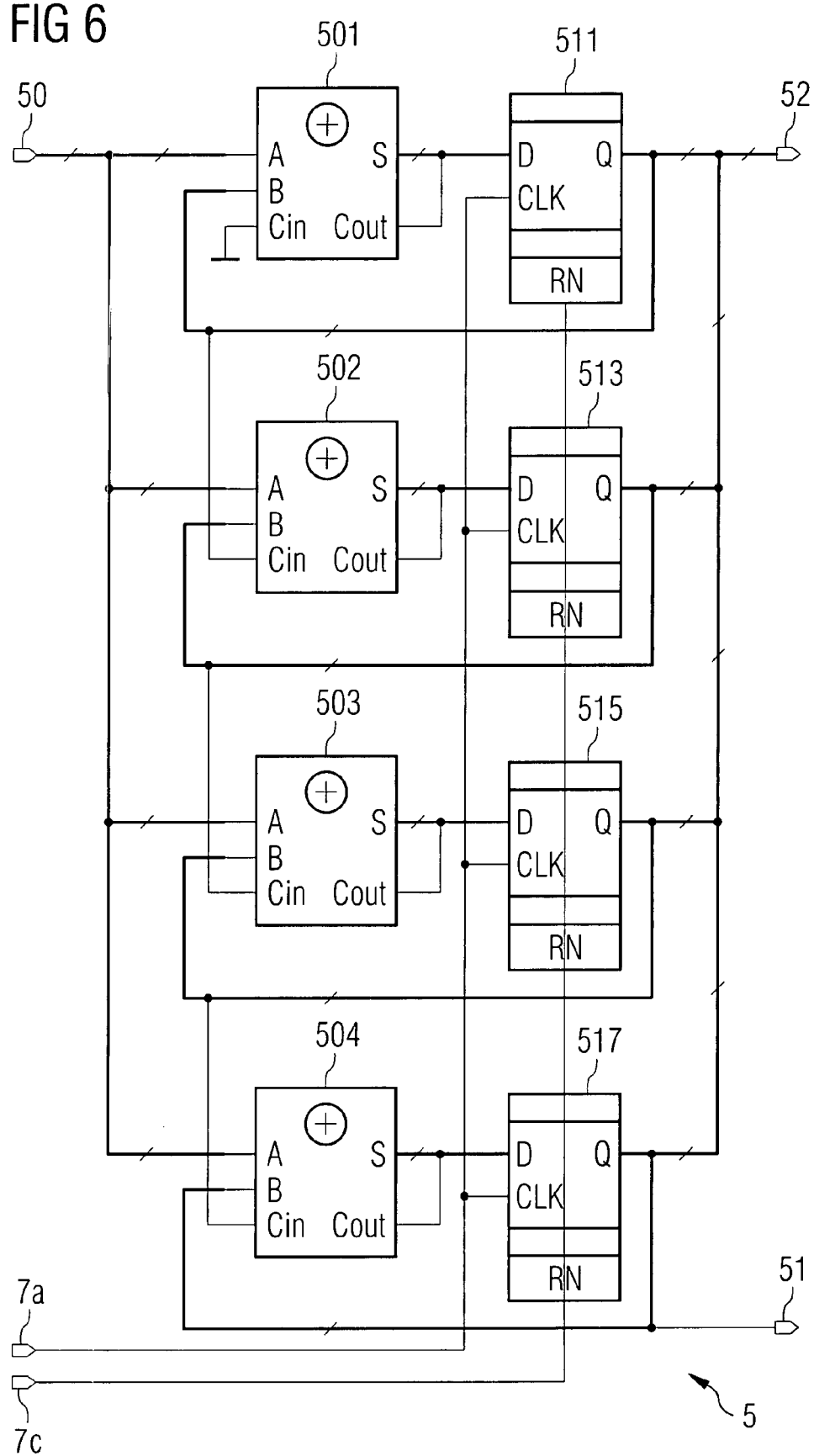
FIG. 6 shows an exemplary embodiment of a further modulation stage.

FIG. 6 shows an exemplary embodiment of another modulation stage. Like the adders 401 to 404, the adders 501 to 504 in the second modulation stage 5 are also in the form of two-bit full adders. The delay elements 511 to 517 are formed by master-slave flip-flops. The output 52 of the second modulation stage 5 can in turn output a further result word and supply it to a further modulation stage, for example in order to implement a third-order sigma-delta modulator. The output 51 outputs the carry bit from the second modulation stage 5.

It can again be seen from FIGS. 5 and 6 that the delay elements 511, 513, 515, 517 of the second modulation stage 5 correspond to the delay elements 411, 413, 415, 417 of the first modulation stage 4, but no delay elements corresponding to delay elements 412, 414, 416 of the first modulator stage 4 are provided in the second modulation stage 5.

Figure 7:
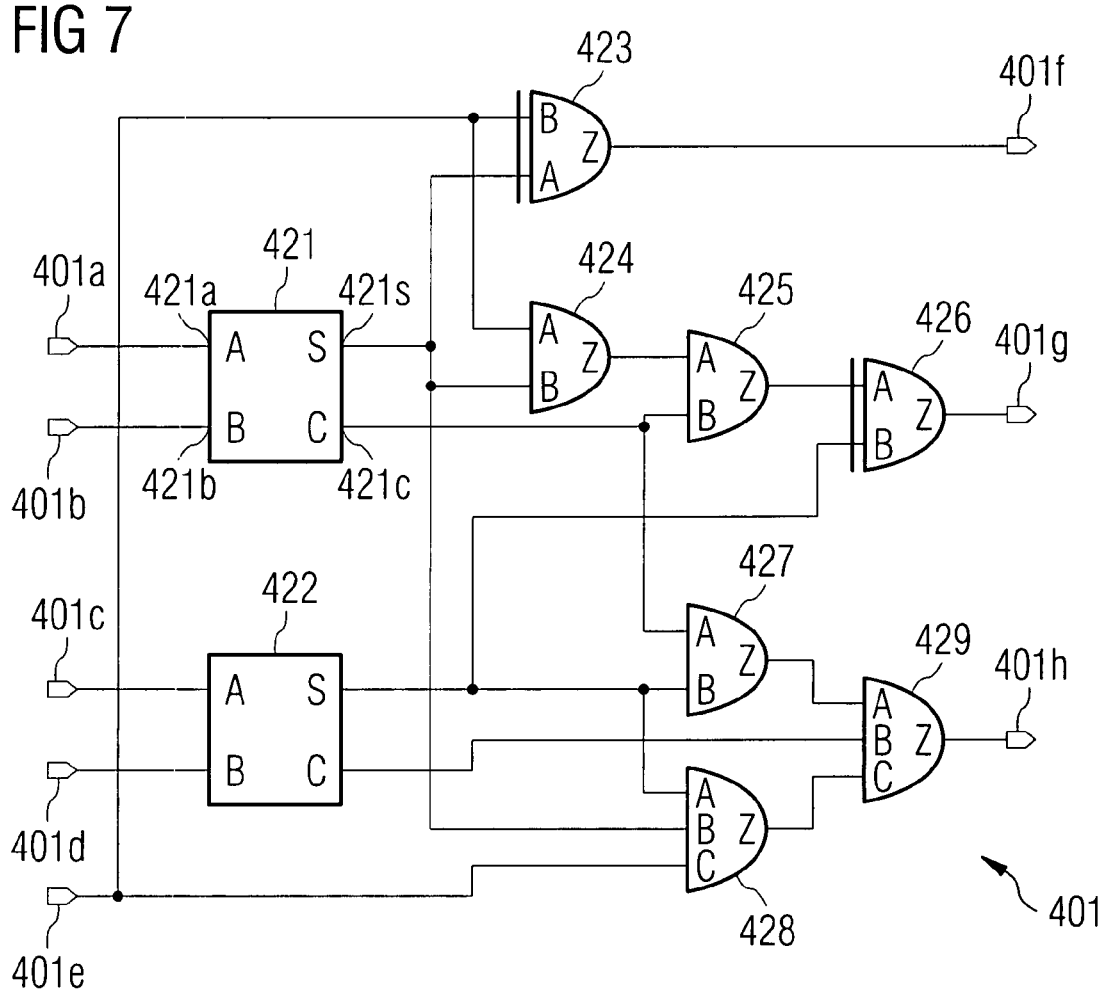
FIG. 7 shows an exemplary embodiment of a two-bit full adder.

FIG. 7 shows an exemplary embodiment of a two-bit full adder such as may be used for the adder 401, for example. Such an adder may also be called a carry look ahead adder. The adder 401 comprises two half adders 421 and 422. In addition it has inputs 401a to 401e. In this case, the input 401a is used to supply a low-significance bit from the split data word, the input 401b is used to supply a Low-significance bit from the returned component, the input 401c is used to supply a more significant bit from the component of the data word, the input 401d is used to supply a more significant bit from the returned component and the input 401e is used to supply a carry bit from a preceding addition.

The half adder 421 has inputs 421a and 421b which are coupled to the inputs 401a and 401b of the full adder 401. The result from the half adder 421 is output at the outputs 421s and 421c. The half adder 422 is connected up accordingly.

The XOR elements 423, 426, the AND elements 424, 427, 428 and the OR elements 425, 429 are used to ascertain the full adder's result from the results from the half adders 421 and 422 and the carry supplied at the input 401e, and said result is output at the outputs 401f, 401g, 401h. In this case, the output 401f generates a low-significance bit, the output 401g generates a more significant bit and the output 401h generates a carry bit.

Figure 8:
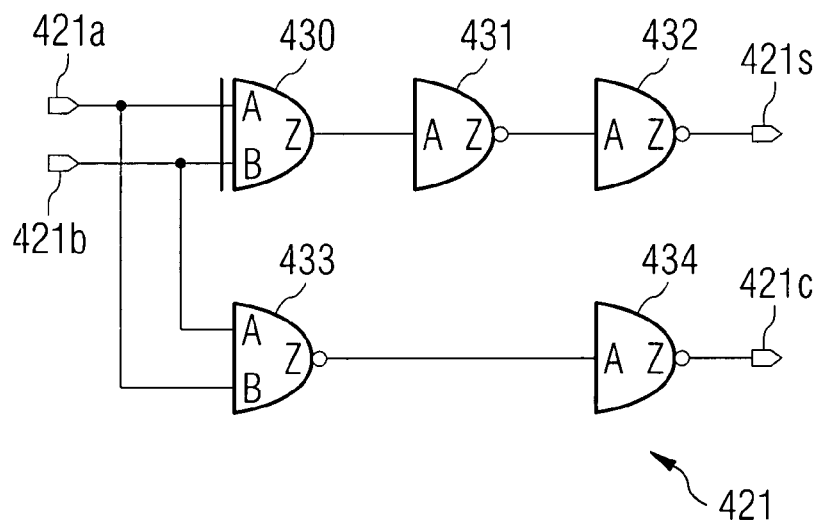
FIG. 8 shows an exemplary embodiment of a half adder.

FIG. 8 shows an exemplary embodiment of a half adder which may be used for the half adder 421, for example. The inputs 421a and 421b are supplied with the bits which are to be added. The addition is performed by means of the XOR element 430, the AND element 433 and the inverters 431, 432, 434. The output 421s outputs the result of the addition and the output 421c outputs a carry.

Figure 9:
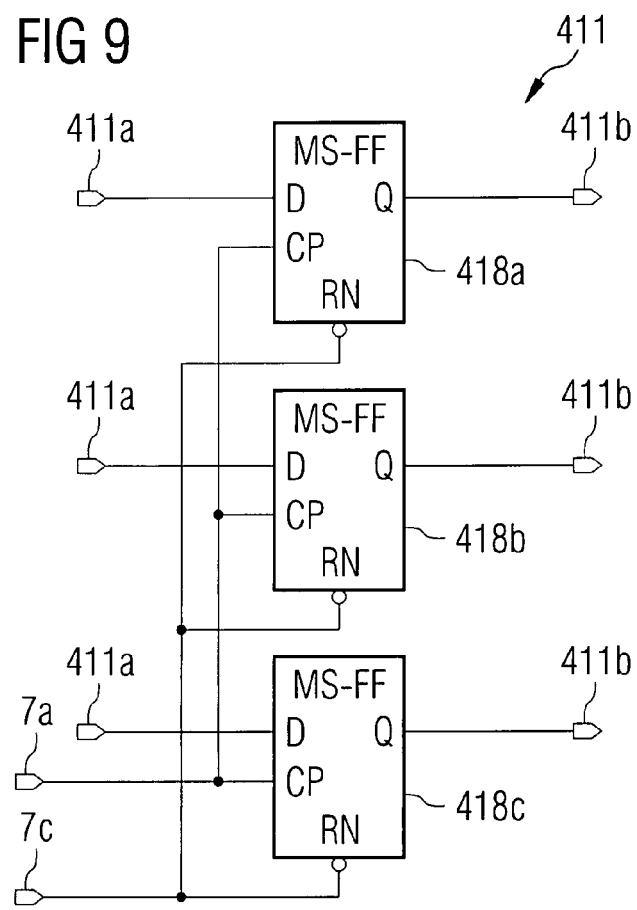
FIG. 9 shows an exemplary embodiment of a delay element.

FIG. 9 shows an exemplary embodiment of a delay element as may be used for a delay element 411, for example. The delay element 411 can delay three data bits in parallel. This is done using three master-slave flip-flops 418a, 418b, 418c, which are operated under the clocking of the modulator clock signal. An input 411a has the data bits to be delayed applied to it, characterized by their signal state. At the time of the next rising clock edge of the modulator clock signal, the state at the inputs 411a is transferred to the outputs 411b. As already mentioned, the output of the delay element 411 outputs a clock-synchronous signal even if the result of an addition is not available in a steady state until shortly before the rising clock edge, for example.

Figure 10:
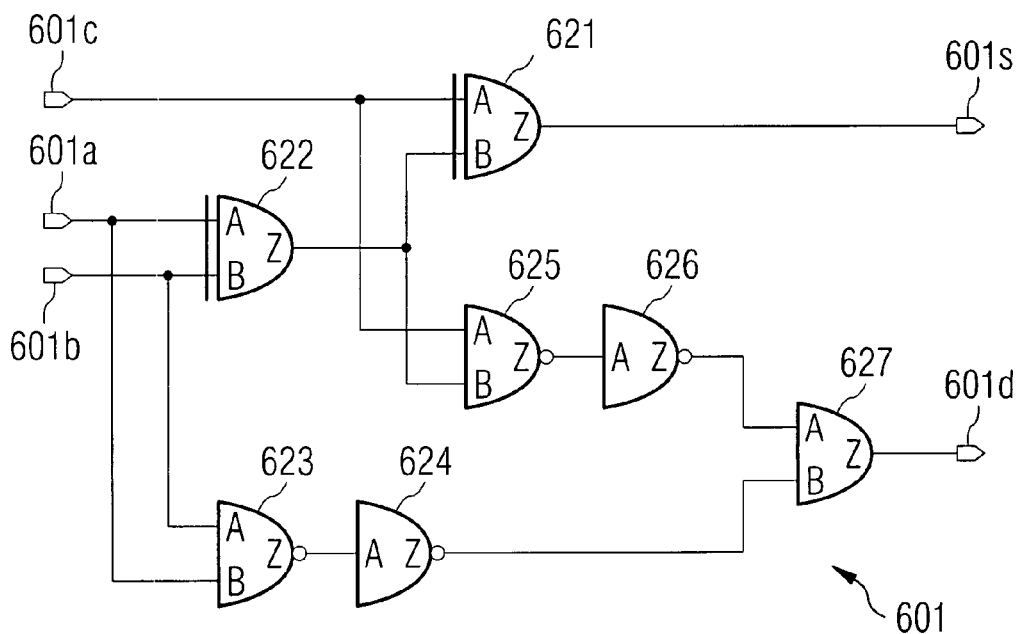
FIG. 10 shows an exemplary embodiment of a single-bit full adder.

FIG. 10 shows an exemplary embodiment of a single-bit full adder as may be used in the carry computation register 6, for example. The inputs 601a, 601b, 601c of the adder 601 are supplied with bits to be added and a carry. The result which is output at the outputs 601s and 601d is ascertained by the XOR elements 621, 622, the NAND elements 623, 625, the inverters 624, 626 and the AND element 627.

Figure 11:
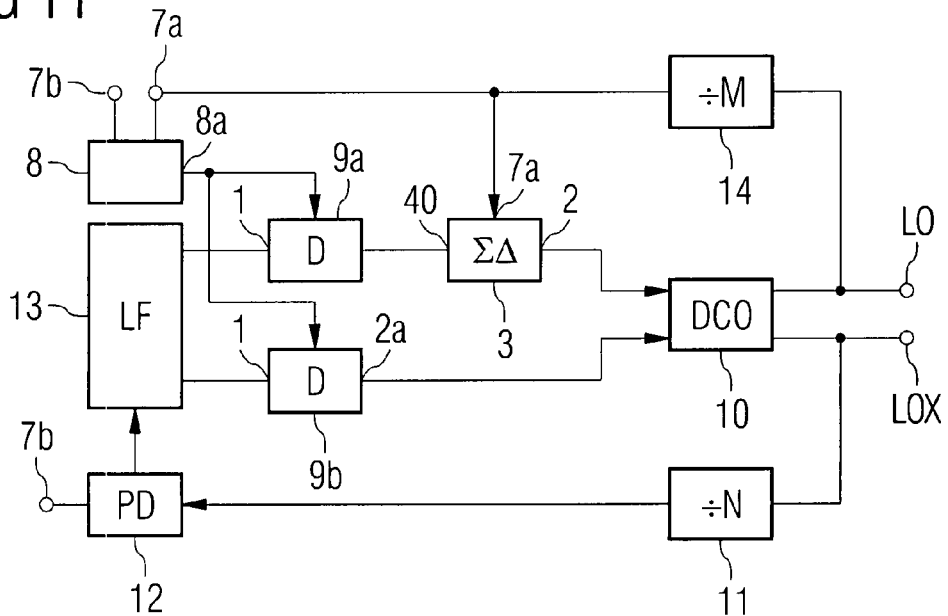
FIG. 11 shows an exemplary embodiment of a digitally controlled phase locked loop with a sigma-delta modulator.

FIG. 11 shows an exemplary embodiment of a digitally controlled phase locked loop with a sigma-delta modulator. The phase locked loop comprises a digitally controlled oscillator 10 from whose outputs LO, LOX it is possible to tap off an oscillator signal. The oscillator signal is supplied to a digital phase and/or frequency detector 12 via a frequency divider 11 with a divider ratio N. The digital phase and/or frequency detector also has a reference clock input 7b via which it is possible to supply a reference clock signal. An output of the phase detector 12 is coupled to a digital loop filter 13.

The oscillator signal is also supplied via a frequency divider 14 with a divider ratio M to a modulation unit 3 in a sigma-delta modulator and to a synchronization device 8. The synchronization device 8 likewise has a reference clock input 7b. A control output 8a couples the synchronization device 8 to a first delay device 9a and to a second delay device 9b. The input 1 of the delay devices 9a and 9b is connected to the output of the loop filter 13. An output of the first delay device 9a is coupled to the input 40 of the modulator unit 3. The modulator output 2 of the modulator unit 3 and the data output 2a of the second delay element 9b are coupled to the digitally controlled oscillator 10.

The phase detector 12 compares the phase and/or frequency of the returned oscillator signal with that/those of the reference clock signal. The comparison result is processed via the digital loop filter 13 to generate a data word. The data word has an integer component for frequency adjustment in the digitally controlled oscillator 10 and a non-integer fractional component. The fractional component is processed by the sigma-delta modulator. In this case, the data word is first of all output in clock synchronism with the reference clock signal. The sigma-delta modulator's modulation unit is operated at a much higher clock frequency, however. If the digitally controlled oscillator 10 outputs a frequency of approximately 4 GHz, for example, then the clock frequency in the sigma-delta modulator for a divider ratio M of 4 is approximately 1 GHz, whereas the reference clock signal has a frequency of approximately 26 MHz, for example. To synchronize the timing of the data word to the frequency of the modulator clock signal, the data word is respectively delayed as appropriate by the delay devices 9a and 9b, under the control of the synchronization device 8. The delay device 9b can also compare processing times for the sigma-delta modulator's modulation unit 3. In theory, the divider ratios N, M may be chosen arbitrarily, including at unity.

The fractional component of the data word is split into a low-significance component and more significant components in the modulator unit 3. If the digitally controlled oscillator 10 is designed for operation for a plurality of mobile radio standards, such as GSM/EDGE and UMTS, then a frequency step size for adjusting the frequency in the digitally controlled oscillator 10 is usually relatively large. This is caused by the frequency bandwidth required being high, as in UMTS, for example. A finer frequency resolution is achieved through the use of such a sigma-delta modulator with a fractional component of eight bits, for example. Splitting the fractional component over a plurality of adders operating in parallel which have a relatively small bit length ensures clock-synchronous processing in the sigma-delta modulator even at a high clock frequency for the modulator clock signal and with the long bit length of the fractional component.

In another embodiment, the sigma-delta modulator comprises a modulator clock input for supplying a modulator clock signal, a reference clock input for supplying a reference clock signal, and a data output. In addition, the sigma-delta modulator has a synchronization device and also a first and a second delay device. The synchronization device is coupled to the modulator clock input and to the reference clock input and has a control output. The first delay device is designed for respectively delaying the low-significance and the more significant component of the data word. It is coupled to the control output and is connected between the data input and the first modulation stage. The second delay device is designed for delaying an integer component of the data word, is coupled to the control output and is connected between the data input and the data output.

In this case, the data input has a data word applied to it which comprises an integer component and a fractional component. The fractional component comprises a low-significance component and more significant components, which are intended to be processed in the at least one modulation stage of the sigma-delta modulator. In this case, the data word can change at a clock rate which corresponds to the clock rate of the reference clock signal. By contrast, the at least one modulation stage is operated at a clock rate for the modulator clock signal. The synchronization device, which controls the first and second delay devices, synchronizes the component of the data for processing in the at least one modulation stage and the integer component, which is output at the data output.

In one further embodiment, the synchronization device is designed to generate a first clock signal, which is derived from the reference clock signal, a second clock signal, which corresponds to the first clock signal delayed by at least one clock period of the modulator clock signal, and a pulsed signal derived from the second clock signal. The first delay device comprises a first delay element, which can be actuated by means of the first clock signal, and a second delay element which is connected thereto and which can be actuated by means of the second clock signal. The second delay device has a first delay element, which can be actuated by means of the first clock signal, and a second delay element which is connected thereto and which can be actuated by means of the pulsed signal. In this case, the frequency of the first clock signal may correspond to the frequency of the reference clock signal.

The respective first delay element in the first and second delay devices is used to synchronize the components of the data word to a common, standard clock cycle for the first clock signal. A further delay in the first delay device is generated on the basis of the second clock signal, while a further delay in the second delay device is dependent on the pulsed signal. This means that the delay in the integer and fractional components in the data word can deliberately be controlled in different fashion.

The second delay element in the first delay device may have a third delay element connected downstream of it which can be actuated by the modulator clock signal. This allows a higher signal stability to be ensured, for example.

The synchronization device may be provided with an inverter whose input side is coupled to the reference clock input and which is designed to output the first clock signal. In this case, the first clock signal corresponds to the inverted reference clock signal, for example.

In one embodiment, the synchronization device comprises at least one further delay element and a logic gate which are designed to generate the pulsed signal. By way of example, the logic gate may be in the form of an AND element with an inverting input and a noninverting input, the inputs of the AND element being supplied with the second clock signal with a different delay. This means that upon the rising clock edge of the second clock signal, for example, a short pulse is generated whose length is dependent on the delay in the second clock signal at the inputs of the AND element.

The second delay device may also be configured to compensate for delays in the bit stream with respect to the integer component of the data word. This means that not only is synchronization to a standard clock cycle for the integer and fractional components ensured, but it is also possible to take account of processing times for the modulation stages. Hence, the bit stream at the modulator output and the integer component of the data word at the data output have synchronous timing.

In one of the embodiments described, the sigma-delta modulator may be used in a digitally controlled phase locked loop. Other possibilities for use are in an analog-digital or digital-analog converter or for actuating a frequency divider with an adjustable divider ratio, for example.

Figure 12:
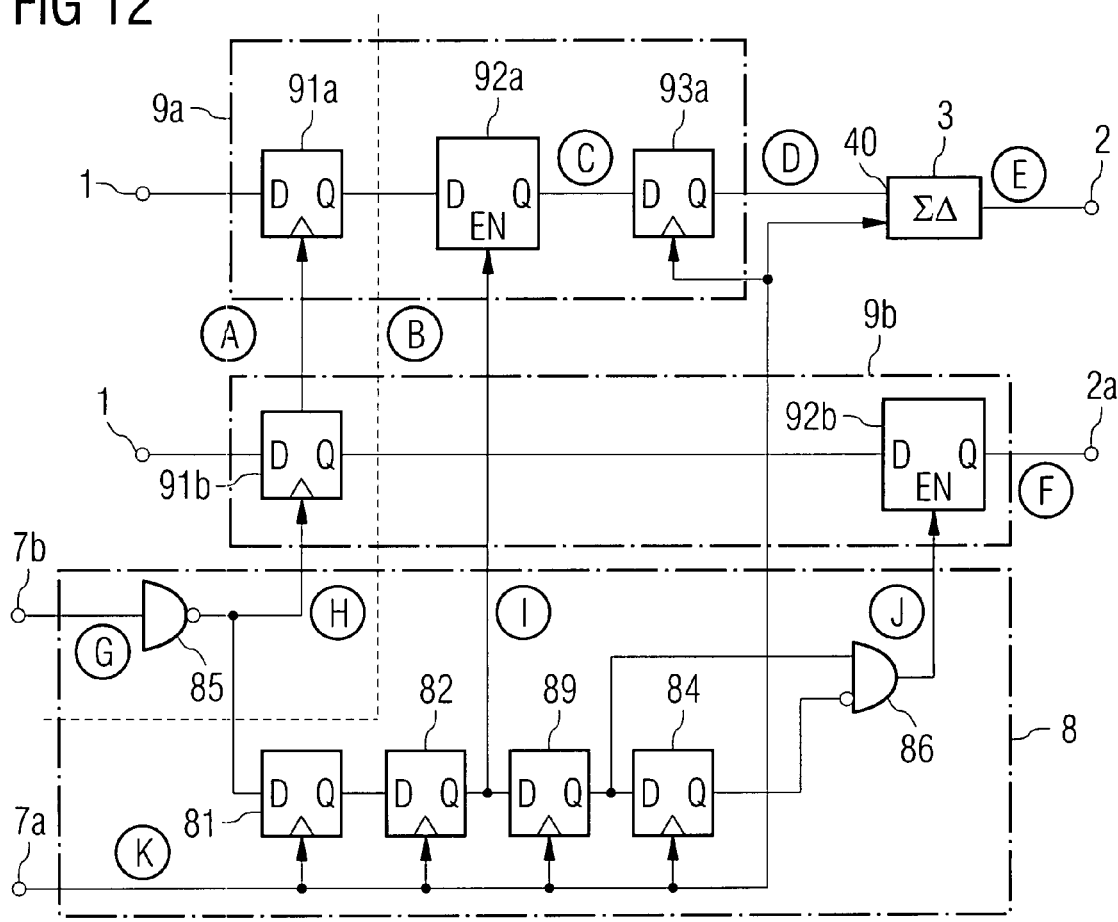
FIG. 12 shows a fourth exemplary embodiment of a sigma-delta modulator.

FIG. 12 shows another exemplary embodiment of a sigma-delta modulator which comprises a synchronization device 8, a first delay device 9a, a second delay device 9b and a modulator unit 3. The synchronization device 8 is supplied with a modulator clock signal K and a reference clock signal G via a modulator clock input 7a and a reference clock input 7b. A time profile for the signals can be found in the exemplary signal timing diagram in FIG. 13.

The data input 1 is used to supply the delay devices 9a and 9b with a data word A, which may also have slight jitter on account of signal propagation times.

The synchronization device 8 comprises an inverter 85, delay elements 81, 82, 83, 84 and a logic gate 86. The output of the inverter 85 generates the inverted reference clock signal as a first clock signal H. This signal H is used to actuate a first delay element 91a in the first delay device 9a and a first delay element 91b in the second delay device 9b. Accordingly, the delay elements 91a and 91b connect the data word A to their output upon the positive clock edge of the signal H, and it is present on said outputs as a delayed data word B. In this case, the signal is essentially still in clock synchronism with the reference clock signal.

The delay elements 81 and 82, which are operated under the clocking of the modulator clock signal K, are used to derive a second clock signal I from the first clock signal H. Said second clock signal is accordingly delayed by two clock periods of the modulator clock signal in comparison with the first clock signal H. A second delay element 92a, which is in the form of a D-type flip-flop, for example, is actuated by the second clock signal I. This further delays the delayed data word B by two clock cycles of the modulator clock signal, which generates the signal C. Upon the next rising clock edge of the modulator clock signal K, the signal C is forwarded by the delay element 93a as signal D and is supplied to the modulator unit 3. The modulator unit 3 is also supplied with the modulator clock signal K.

To synchronize the fractional and integer components of the data word, a pulsed signal J is generated using the delay elements 83 and 84, which are operated under the clocking of the modulator clock signal K, and the logic gate 86. Said pulsed signal is supplied to a second delay element 92b in the second delay device 9b in order to output the integer component of the delayed data word B as data word F with adapted timing and in synch with the modulator clock signal. The delay element 92b is shown as a D-type flipflop in the exemplary embodiment but may also be implemented using a master-slave flip-flop.

The delay elements 81 to 84, 91a, 91b and 93a are in the form of master-slave flip-flops which connect a signal state which is on the input to the output upon a positive clock edge and hold it until the next positive clock edge.

The use of two delay elements 81 and 82 in the synchronization device 8 ensures that the signal B has reached a steady state at the time at which it is forwarded via the delay element 92a. As a modification to this embodiment, one of the delay elements 81 or 82 could be omitted however.

In another embodiment, the delay element 92a could be omitted and at the same time the delay element 93a could be actuated with a pulsed signal, which may be generated in similar fashion to the pulsed signal J. Since the delay in this instance is reduced by one clock period of the modulator clock signal, the delay for generating the signal J would need to be adapted accordingly.

The second delay element 92b in the second delay device 9b could also be replaced by a master-slave flip-flop, which could then be actuated by means of a delayed reference clock signal at the output of the delay element 83.

Figure 13:
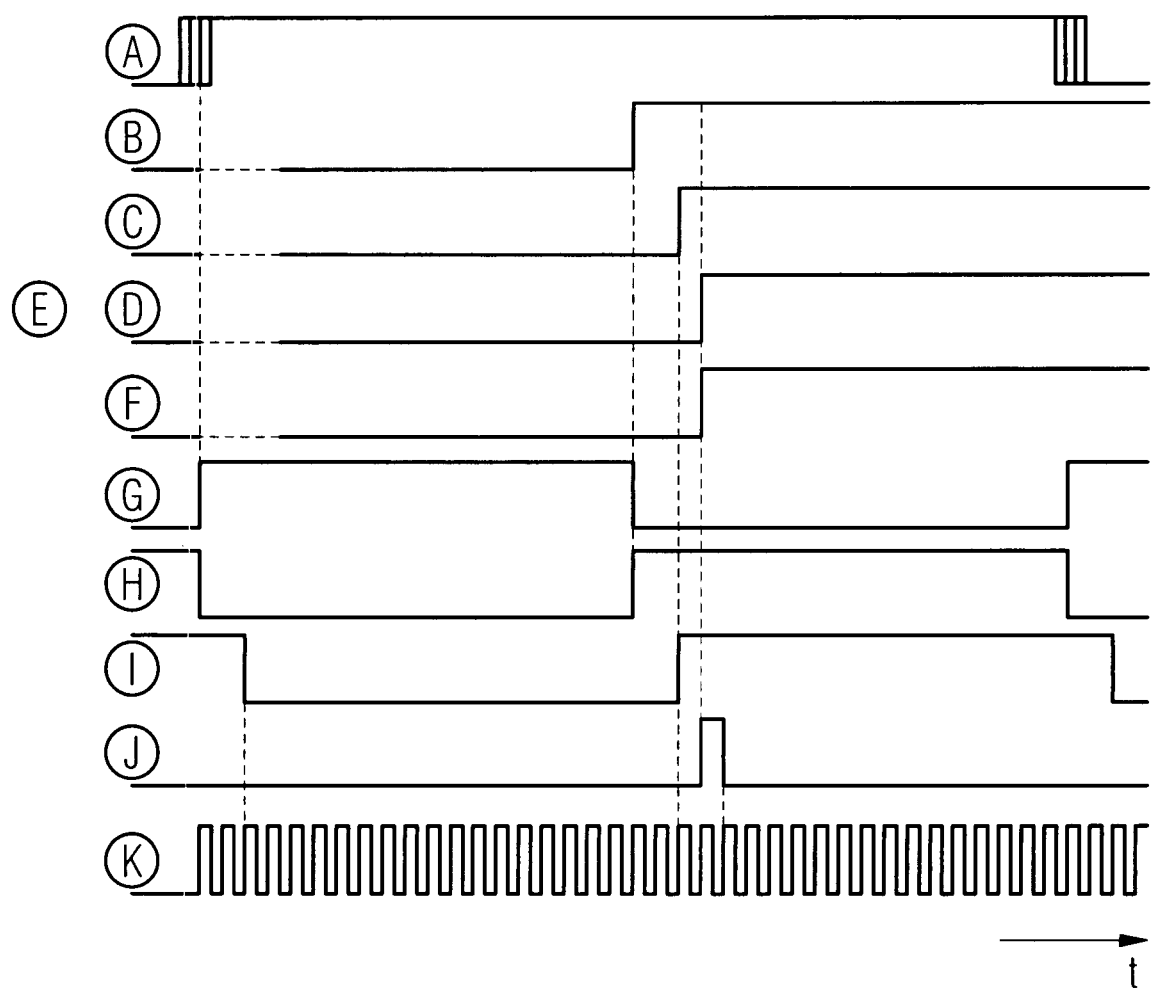
FIG. 13 shows an exemplary signal timing diagram for signals in a sigma-delta modulator as shown in FIG. 12.
Figure 14:
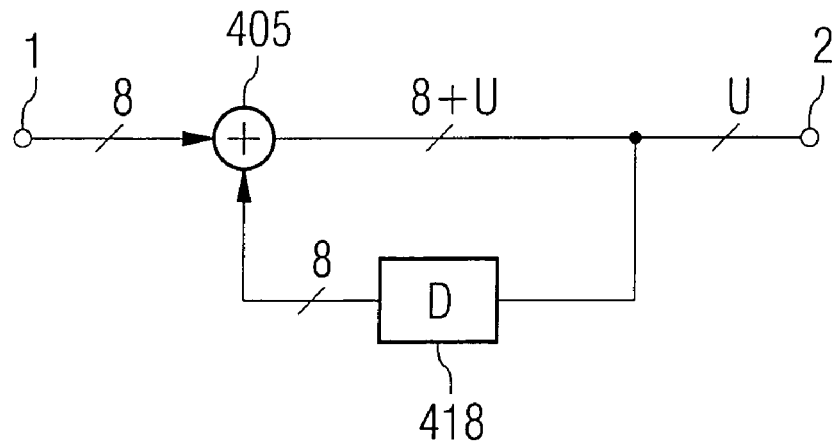
FIG. 14 shows an exemplary embodiment of a conventional first-order sigma-delta modulator.
Figure 15:
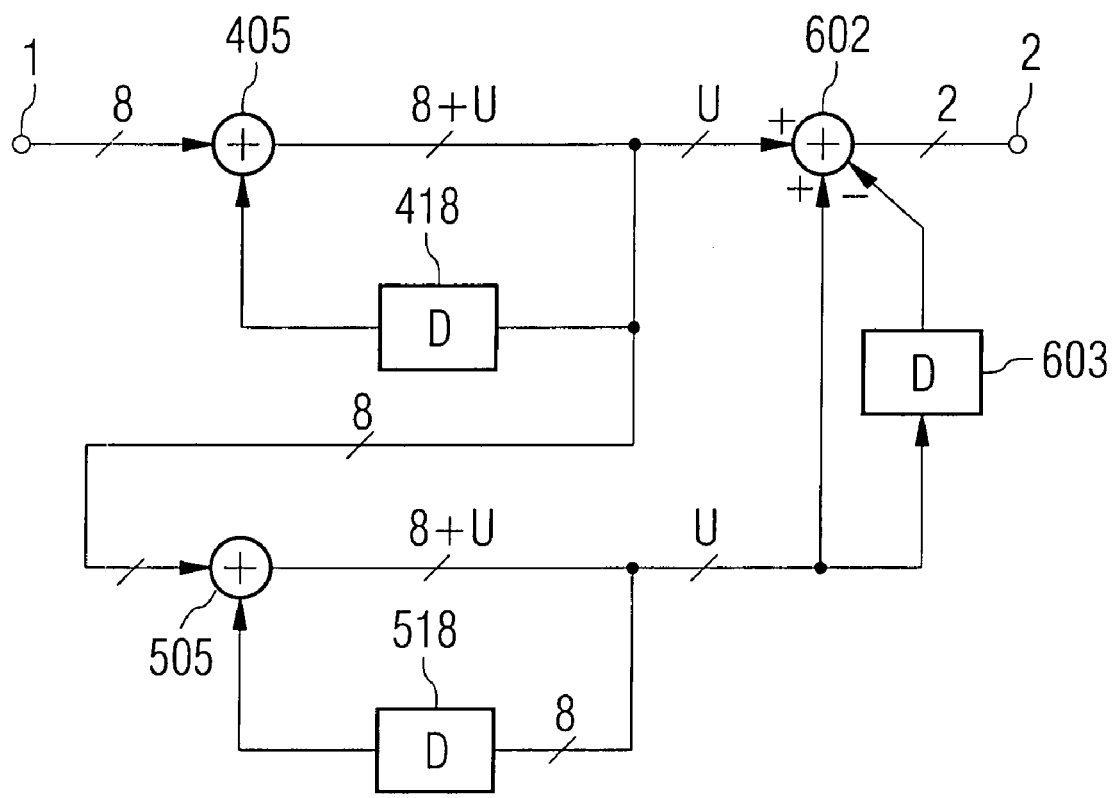
FIG. 15 shows an exemplary embodiment of a conventional second-order sigma-delta modulator.

In the signal timing diagram shown in FIG. 13, it is assumed that the processing in the modulator unit 3 does not generate any delays and hence the bit stream E at the output 2 is in time synch with the data word D at the input 40. The modulator unit shown in FIG. 3 has a processing time of six clock cycles of the modulator clock signal. To synchronize the timing of the bit stream E and of the integer data word F at the data output 2a, additional delay elements need to be provided in the synchronization device 8, for example upstream of the delay element 83.

Even if first-order and second-order sigma-delta modulators with a word length of 8 bits have been shown in the exemplary embodiments, also sigma-delta modulators of a higher order and/or with a different word length for the input data word can be employed. Similarly, splitting is possible over adders other than two-bit binary adders. The use of such a sigma-delta modulator is not limited to the actuation of a digitally controlled oscillator. Similarly, it may be used for analog-digital conversion, digital-analog conversion or for controlling a divider ratio in a frequency divider, for example.

In an embodiment of a method for sigma-delta modulation a data word is supplied and this data word is split into a low-significance component and at least one more significant component. The at least one more significant component of the data word is delayed. A first addition is performed in a first modulation stage, which involves addition of the low-significance component of the data word and a delayed first result from the first addition in the first modulation stage. In doing this, a carry from the first addition is provided. At least one second addition is performed in the first modulation stage, which involves addition of the delayed at least one more significant component of the data word, a delayed second result from the second addition in the first modulation stage and a delayed carry from a preceding addition in the first modulation stage. A carry is also provided from the at least one second addition. A bit stream is derived from the carry from a final instance of the at least two additions in the first modulation stage.

In this case, the first addition is the preceding addition for a second addition. If three additions are performed then the second addition is the preceding addition for the third addition. With a total of two additions, the second addition is the final addition, whereas for a total of three additions, the third addition is the final addition from whose carry the bit stream is derived. By splitting the data word over a plurality of additions with reduced computation complexity, it is possible to ensure that the method can be applied reliably even for a relatively long word length of the data word and relatively high clock frequencies.

In this context, a delay in the at least one more significant component of the data word for the at least one second addition in the first modulation stage may be greater than for a preceding addition in the first modulation stage. This means that the delay in the component for a second addition is greater than the delay for a first addition, the delay in a component for a third addition is greater than the delay for a second addition, and so on.

In one further embodiment, a result word is formed from the results of the additions in the first modulation stage with an unvarying delay, that means the respective results from the adders of the first modulation stage are not delayed differently. This result word is split into a low-significance component and at least one more significant component. In a first addition in an at least one further modulation stage, the low-significance component of the result word and a delayed first interim result from the first addition in the further modulation stage are added. In so doing, a carry is provided from the first addition in the further modulation stage. At least one second addition is performed in the further modulation stage, which involves summation of the at least one more significant component of the result word, a delayed second interim result from the second addition in the further modulation stage and a delayed carry from a preceding addition in the further modulation stage. A carry is also provided from the at least one second addition in the further modulation stage. Derivation of the bit stream involves the latter also being derived from a carry from a final instance of the at least two additions in the further modulation stage.

As for the first modulation stage, the first addition in the further modulation stages is also the preceding addition for the second addition. If two additions are performed in the further modulation stage then the second addition is therefore the final addition.

The number of modulation stages determines the order of the sigma-delta modulation. In this context, the bit stream is derived with a word length which corresponds to the number of modulation stages.

In a further embodiment, the data word also comprises an integer component. A modulator clock signal and a reference clock signal are supplied. The low-significance and more significant components of the data word are delayed on the basis of the modulator clock signal and the reference clock signal. The modulator clock signal and the reference clock signal are also taken as a basis for delaying the integer component. The delay synchronizes the timing of the bit stream and of the integer component of the data word.

In one embodiment, a first clock signal is generated which is derived from the reference clock signal, and a second clock signal is generated which corresponds to the clock signal delayed by at least one clock period of the modulator clock signal. A pulsed signal is derived from the second clock signal. Delaying the low-significance and more significant components of the data word involves a delay being controlled by the first and second clock signals, whereas delaying the integer component of the data word involves a delay being controlled by the first clock signal and the pulsed signal. By controlling the delay by the first clock signal both for the low-significance and more significant components and for the integer component of the data word, these are synchronized to a standard clock cycle for the first clock signal. As a result of the different control of the delay by means of the second clock signal and the pulsed signal, the components can be delayed differently and hence it is possible to compensate for differences in the processing time or propagation time of the bit stream and of the integer component. In this context, a period duration for the first and second clock signals may correspond to the period duration of the reference clock signal.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

The invention claimed is:

1. A sigma-delta modulator, comprising:
   a data input configured to receive a data word;
   a first modulation stage comprising at least two adders;
   at least one further modulation stage comprising at least two adders; and
   a modulator output configured to output a bit stream;
   wherein a first adder in the first modulation stage comprises a first input configured to receive a low-significance component of the data word, a second input configured to a delayed first result from the first adder and an output configured to output the first result with a carry;
   wherein an at least one second adder in the first modulation stage comprises a first input configured to receive a delayed more significant component of the data word, a second input configured to receive a delayed second result from the at least one second adder, a third input configured to receive a delayed carry from a preceding adder and an output configured to output the second result with a carry;
   wherein the results from the adders in the first modulation stage form a result word which is provided to the adders of the further modulation stage with an unvarying delay therebetween;
   wherein a first adder in the further modulation stage comprises a first input configured to receive a low-significance component of the result word, a second input configured to receive a delayed first interim result from the first adder, and an output configured to output the first interim result with a carry;
   wherein an at least one second adder in the further modulation stage comprises a first input configured to receive a more significant component of the result word, a second input configured to receive a delayed second interim result from the at least one second adder, a third input configured to receive a delayed carry from a preceding adder and an output configured to output the second interim result with a carry; and
   wherein the bit stream is derived from a carry from a final one of the at least two adders in the first modulation stage and from a carry from a final one of the at least two adders in the further modulation stage.

2. The sigma-delta modulator of claim 1, wherein the at least one second adder comprises two or more second adders, and wherein a delay in the more significant component of the data word at the first input of a subsequent one of the at least one second adder in the first modulation stage is greater than the delay in the more significant component for a preceding second adder in the first modulation stage.

3. The sigma-delta modulator of claim 1, wherein a word length in the bit stream corresponds to a number of modulation stages.

4. The sigma-delta modulator of claim 1, wherein a portion of the components of the data word or results from the adders are respectively delayed by delay elements.

5. The sigma-delta modulator of claim 4, wherein the delay elements are operated in clocked fashion.

6. The sigma-delta modulator of claim 1, further comprising:
   a modulator clock input configured to receive a modulator clock signal;
   a reference clock input configured to receive a reference clock signal;
   a data output;
   a synchronization device coupled to the modulator clock input and to the reference clock input, and comprising a control output;
   a first delay device configured to delay the low-significance and the more significant component of the data word, coupled to the control output and connected between the data input and the first modulation stage; and
   a second delay device configured to delay an integer component of the data word, coupled to the control output and connected between the data input and the data output.

7. The sigma-delta modulator of claim 6, wherein:
   the synchronization device is configured to generate a first clock signal, which is derived from the reference clock signal, a second clock signal, which corresponds to the first clock signal delayed by at least one clock period of the modulator clock signal, and a pulsed signal which is derived from the second clock signal;
   the first delay device comprises a first delay element, which is actuated by means of the first clock signal, and a second delay element which is connected thereto and which is actuated by means of the second clock signal; and
   the second delay device comprises a first delay element, which is actuated by means of the first clock signal, and a second delay element which is connected thereto and which is actuated by means of the pulsed signal.

8. The sigma-delta modulator of claim 7, wherein the first delay device comprises a third delay element which is connected downstream of the second delay element and which is actuated by the modulator clock signal.

9. The sigma-delta modulator of claim 7, wherein the synchronization device comprises an inverter, whose input side is coupled to the reference clock input, and is configured to output the first clock signal.

10. The sigma-delta modulator of claim 7, wherein the synchronization device comprises at least one delay element which is configured to delay the first clock signal.

11. The sigma-delta modulator of claim 7, wherein the synchronization device comprises at least one delay element and a logic gate, and is configured to generate the pulsed signal.

12. The sigma-delta modulator of claim 6, wherein the second delay device is configured to compensate for delays in the bit stream over the integer component of the data word.

13. A digitally controlled phase locked loop comprising a digitally controlled oscillator and a sigma-delta modulator according to claim 1, wherein the modulator output of the sigma-delta modulator is coupled to a control input of the digitally controlled oscillator.

14. A method for sigma-delta modulation, comprising:
   supplying a data word;
   splitting the data word into a low-significance component and at least one more significant component;
   delaying the at least one more significant component of the data word;
   performing a first addition in a first modulation stage of the low-significance component of the data word and a delayed first result from the first addition in the first modulation stage;

providing a carry from the first addition in the first modulation stage;
performing at least one second addition in the first modulation stage of the delayed at least one more significant component of the data word, a delayed second result from the second addition in the first modulation stage and a delayed carry from a preceding addition in the first modulation stage;
providing a carry from the at least one second addition in the first modulation stage;
forming a result word from the results of the additions in the first modulation stage with an unvarying delay therebetween;
splitting the result word into a low-significance component and at least one more significant component;
performing a first addition in an at least one further modulation stage of the low-significance component of the result word and a delayed first interim result from the first addition in the further modulation stage;
providing a carry from the first addition in the further modulation stage;
performing at least one second addition in the further modulation stage of the at least one more significant component of the result word, a delayed second interim result from the second addition in the further modulation stage and a delayed carry from a preceding addition in the further modulation stage;
providing a carry from the at least one second addition in the further modulation stage; and
deriving a bit stream from a carry from a final instance of the at least two additions in the first modulation stage and from a carry from a final instance of the at least two additions in the further modulation stage.

15. The method of claim 14, wherein a delay in the at least one more significant component of the data word for the at least one second addition in the first modulation stage is greater than for a preceding addition in the first modulation stage.

16. The method of claim 14, wherein the bit stream is derived with a word length which corresponds to the number of modulation stages.

17. The method of claim 14, wherein the data word also comprises an integer component, and further comprising:
supplying a modulator clock signal;
supplying a reference clock signal;
delaying the low-significance and more significant components of the data word on the basis of the modulator clock signal and the reference clock signal;
delaying the integer component of the data word on the basis of the modulator clock signal and the reference clock signal; and
synchronizing the timing of the bit stream and the integer component of the data word depending on the delay.

18. The method of claim 17, further comprising:
generating a first clock signal derived from the reference clock signal;
generating a second clock signal corresponding to the first clock signal delayed by at least one clock period of the modulator clock signal;
generating a pulsed signal derived from the second clock signal;
wherein the respective delaying of the low-significance and more significant components of the data word comprises the delay being controlled by the first and second clock signals; and
wherein the delaying of the integer component of the data word comprises the delay being controlled by the first clock signal and the pulsed signal.

19. The method of claim 18, wherein a period duration for the first and second clock signals corresponds to a period duration for the reference clock signal.

20. A sigma-delta modulator, comprising:
a data input configured to receive a data word;
a first modulation stage comprising at least two adders configured to process a low-significance component of the data word and a delayed more significant component of the data word and to provide a result word and a carry at the respective outputs of the adders in the first modulation stage;
at least one further modulation stage having at least two adders configured to process a low-significance component of the result word and a more significant component of the result word and provide a further result word and a carry at the respective outputs of the adders in the at least one further modulation stage; and
a modulator output configured to output a bit stream;
wherein the low-significance component of the result word and the more significant component of the result word are provided to the at least one further modulation stage with an unvarying delay therebetween; and
wherein the bit stream is derived from a carry from a final one of the at least two adders in the first modulation stage and from a carry from a final one of the at least two adders in the further modulation stage.

* * * * *